US009179586B2

(12) United States Patent
Brun

(10) Patent No.: US 9,179,586 B2
(45) Date of Patent: Nov. 3, 2015

(54) METHOD FOR ASSEMBLING A CHIP IN A FLEXIBLE SUBSTRATE

(75) Inventor: Jean Brun, Champagnier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 281 days.

(21) Appl. No.: 13/702,173

(22) PCT Filed: Jul. 5, 2011

(86) PCT No.: PCT/FR2011/000395
§ 371 (c)(1),
(2), (4) Date: Dec. 5, 2012

(87) PCT Pub. No.: WO2012/007655
PCT Pub. Date: Jan. 19, 2012

(65) Prior Publication Data
US 2013/0074331 A1 Mar. 28, 2013

(30) Foreign Application Priority Data

Jul. 6, 2010 (FR) ...................... 10 02846

(51) Int. Cl.
*H05K 3/30* (2006.01)
*H05K 13/04* (2006.01)
(Continued)

(52) U.S. Cl.
CPC .......... *H05K 13/046* (2013.01); *H01L 23/4985* (2013.01); *H01L 23/562* (2013.01); *H01L 24/80* (2013.01); *H01L 24/81* (2013.01); *H01L 24/83* (2013.01); *H01L 24/92* (2013.01); *H05K 1/189* (2013.01); *H01L 23/13* (2013.01); *H01L 23/5389* (2013.01); *H01L 25/0655* (2013.01); *H01L 25/50* (2013.01); *H01L 2224/0401* (2013.01); *H01L 2224/05571* (2013.01);
(Continued)

(58) Field of Classification Search
USPC ................... 29/831, 832, 835, 838, 846, 854; 361/742, 749–751, 804; 174/254, 520, 174/522, 536; 156/184, 289
See application file for complete search history.

(56) References Cited

U.S. PATENT DOCUMENTS 5,401,922 A * 3/1995 Asta .............................. 200/5 A
6,326,544 B1 * 12/2001 Lake ............................. 174/546
(Continued)

FOREIGN PATENT DOCUMENTS

DE 197 55 792 A1 6/1999
DE 103 07 505 A1 9/2004
(Continued)

OTHER PUBLICATIONS

Jan. 8, 2013 Translation of International Preliminary Report on Patentability issued in International Patent Application No. PCT/FR2011/000395.
(Continued)

*Primary Examiner* — Paul D Kim
(74) *Attorney, Agent, or Firm* — Oliff PLC

(57) ABSTRACT

A substrate provided with an electrically conducting wire coated with an electrically insulating material is impregnated with a polymerizable material. A reception area for a chip is formed on a surface of the substrate by means of deformation. The housing area is stiffened using the polymerizable material. The chip is disposed in the reception area and an electrical connection area of the chip is connected electrically to the electrically conducting wire of the substrate.

19 Claims, 5 Drawing Sheets

(51) Int. Cl.
- *H01L 23/498* (2006.01)
- *H01L 23/00* (2006.01)
- *H05K 1/18* (2006.01)
- *H01L 23/13* (2006.01)
- *H01L 23/538* (2006.01)
- *H01L 25/065* (2006.01)
- *H01L 25/00* (2006.01)
- *H05K 1/02* (2006.01)
- *H05K 1/03* (2006.01)

(52) U.S. Cl.
CPC ......... *H01L 2224/08238* (2013.01); *H01L 2224/1134* (2013.01); *H01L 2224/16237* (2013.01); *H01L 2224/2919* (2013.01); *H01L 2224/32237* (2013.01); *H01L 2224/32238* (2013.01); *H01L 2224/73204* (2013.01); *H01L 2224/80006* (2013.01); *H01L 2224/80007* (2013.01); *H01L 2224/80201* (2013.01); *H01L 2224/80903* (2013.01); *H01L 2224/81005* (2013.01); *H01L 2224/81007* (2013.01); *H01L 2224/81191* (2013.01); *H01L 2224/81201* (2013.01); *H01L 2224/81385* (2013.01); *H01L 2224/81801* (2013.01); *H01L 2224/81903* (2013.01); *H01L 2224/83005* (2013.01); *H01L 2224/83007* (2013.01); *H01L 2224/8385* (2013.01); *H01L 2224/83192* (2013.01); *H01L 2224/83201* (2013.01); *H01L 2224/83385* (2013.01); *H01L 2224/90* (2013.01); *H01L 2224/9211* (2013.01); *H01L 2924/00014* (2013.01); *H01L 2924/01057* (2013.01); *H01L 2924/01058* (2013.01); *H01L 2924/0665* (2013.01); *H01L 2924/12041* (2013.01); *H05K 1/0281* (2013.01); *H05K 1/038* (2013.01); *H05K 2201/10545* (2013.01); *H05K 2201/10674* (2013.01); *H05K 2203/0108* (2013.01); *Y10T 29/4913* (2015.01)

(56) References Cited

U.S. PATENT DOCUMENTS

| | | | |
|---|---|---|---|
| 7,444,733 B2 * | 11/2008 | Ho et al. | 29/592.1 |
| 7,447,551 B2 * | 11/2008 | Kuo et al. | 607/152 |
| 2004/0074660 A1 | 4/2004 | Nakamura | |
| 2004/0244193 A1 | 12/2004 | Jung et al. | |
| 2004/0259391 A1 | 12/2004 | Jung et al. | |
| 2006/0035554 A1 | 2/2006 | Glaser et al. | |
| 2006/0254811 A1 | 11/2006 | Kirstein et al. | |
| 2006/0258205 A1 | 11/2006 | Locher et al. | |
| 2009/0026678 A1 * | 1/2009 | Ho et al. | 269/35 |
| 2009/0050352 A1 * | 2/2009 | Chen et al. | 174/254 |
| 2013/0176737 A1 * | 7/2013 | Zhou et al. | 362/249.06 |

FOREIGN PATENT DOCUMENTS

| | | |
|---|---|---|
| EP | 1 489 696 A2 | 12/2004 |
| EP | 1 727 408 A1 | 11/2006 |
| JP | A-4-290478 | 10/1992 |
| JP | H05-36868 U | 5/1993 |
| JP | 2006-332647 A | 12/2006 |
| WO | WO 2005/067042 A1 | 7/2005 |
| WO | WO 2008/120138 A1 | 10/2008 |
| WO | WO 2010/058360 A1 | 5/2010 |

OTHER PUBLICATIONS

Dec. 20, 2011 International Search Report issued in International Patent Application No. PCT/FR2011/000395.

May 12, 2015 Office Action issued in Japanese Patent Application No. 2013-517432.

* cited by examiner

METHOD FOR ASSEMBLING A CHIP IN A FLEXIBLE SUBSTRATE

BACKGROUND OF HE INVENTION

The invention relates to a method for assembling an electronic chip on a substrate.

STATE OF THE ART

In order to conquer new markets, the electronics sector has modified conventional electronic chips so that they are able to stand up to increasingly hostile environments. However, the field of flexible supports is a sector for which numerous problems remain outstanding.

In the field of integration of electronic functions on flexible substrates such as textiles, the problems mainly originate from the flexibility of the substrate itself.

In so far as the chips cannot be produced directly on the flexible substrate, the electronic chips are produced separately and then assembled on this particular substrate.

There again, when it is sought to connect one or more electronic chips to a substrate, conventional assembly methods are ineffective as they require a certain rigidity of the substrate and/or a certain thermal resistance. It is further advantageous to connect the chip to another device, for example another chip or a passive element, which complicates fabrication.

Integration of electronic chips with a textile provided with conducting thread-like wires provides numerous solutions. The textile acts as a flexible substrate and the conducting wires enable the chip to be connected with an outside element.

Examples of production are described in the document US 2004/0074660 and in the document US 2006/0258205. In these two documents, the chip or an adapter are connected to the textile, which gives rise to problems in alignment of the different connections between the chip (adapter) and the textile. In the document US 2004/0074660, the resin is injected once connection has been established in order to perform sealing of the chip with the textile.

It has been proposed to connect a chip to a conducting wire by means of a lateral groove which runs along a side wall of the chip. This method is very difficult to implement and furthermore requires the dimension of the groove to be made to match the diameter of the wire.

In the document WO 2005/067042, several chips formed on a rigid substrate are placed in connection with a textile comprising electric wires. In this embodiment, the advantage of the conducting flexible substrate is lost as the assembly is finally rigid on account of the substrate connecting the different chips. In the document JP 04290478, a rigid substrate is formed by a textile adhering to a supporting plate. The textile comprises conducting wires which are used to supply light-emitting diodes. There again, the advantages of the flexible substrate are lost on account of the rigid supporting plate.

OBJECT OF THE INVENTION

It has been ascertained that a requirement exists to provide a method for assembling an electronic chip with a substrate that is easy to implement and that ensures good mastery of the alignment between the substrate and the chip.

This requirement tends to be met by means of the method according to the appended claims and more particularly by means of a method comprising the following steps:

providing a flexible substrate provided with at least one electrically conducting wire and with a polymerizable material, making the polymerizable material react in a first area of the substrate so as to rigidify this first area of the substrate and to form a housing area of the chip on a surface of the substrate, the housing area representing a more rigid area of the substrate, arranging the chip in the housing area and electrically connecting the electrically conducting wire with an electric connection area of the chip.

BRIEF DESCRIPTION OF THE DRAWINGS

Other advantages and features will become more clearly apparent from the following description of particular embodiments of the invention, given for non-restrictive example purposes only and represented in the appended drawings, in which.

DESCRIPTION OF A PREFERRED EMBODIMENT OF THE INVENTION

Figure 1:
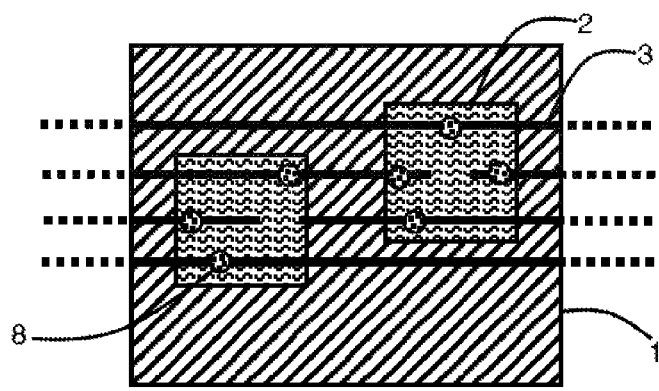
FIG. 1 represents two chips mounted on a substrate, in schematic manner in top view.

As illustrated in FIG. 1, substrate 1 on which chip 2 has to be assembled is a flexible substrate which comprises at least one electrically conducting wire 3. In certain embodiments, wire 3 is totally or partially coated by an electrically insulating material. In other embodiments, electrically conducting wire 3 is not coated by an electrically insulating material.

In a particular embodiment, substrate 1 comprises a plurality of electrically conducting wires 3. Electrically conducting wires 3 can be contained in a single plane inside the substrate, but it is also conceivable to have wires 3 arranged in several parallel planes. For example purposes, substrate 1 comprises two series of wires which represent two parallel planes inside substrate 1.

In an alternative embodiment which can combined with the previous embodiments, substrate 1 also comprises a plurality of electrically non-conducting wires. According to the embodiments used, the wires used are woven or not. The electrically conducting wires can all be oriented in the same direction. It is also conceivable for the conducting wires to be arranged in several directions and organized for example in a matrix.

For example purposes, substrate 1 is a textile comprising wires 3 woven together inside which there exists at least one electrically conducting wire. In another example, substrate 1 comprises a support film which is covered by a conducting wire 3. Substrate 1 is also a film made from electrically insulating material inside which one or more wires 3 are sunk. Mechanical securing between the wires (conducting or not)

can be performed by the support film or by means of the different mechanical connections existing between the different wires.

According to the embodiments used, electrically conducting wire 3 can be sheathed in the electrically insulating material, the assembly keeping the form of a wire, or it can be in a layer of insulating material.

When conducting wire 3 is coated by an insulating material and keeps the form of a wire, the conducting wire which is electrically insulated from the other wires can be used in a woven structure as weft thread or warp thread.

The electrically conducting wire is for example covered by an electrical insulator. It is also conceivable to incorporate an electrically conducting wire covered by an insulating layer inside a substrate that is itself electrically insulating. When the electrically conducting wire is integrated without an insulator, insulation is obtained by the structure of the substrate.

A housing area 5 is then formed on the substrate so as to house chip 2. Housing area 5 for chip 2 represents a more rigid area of substrate 1. This greater rigidity enables the chip to be placed more easily in the housing area thereby preventing too great a deformation of the substrate and of the conducting wire with respect to the chip. In this manner, it is easier to align the chip with the substrate. This is particularly efficient when the chip is integrated on a flexible substrate.

A portion of the substrate can be rigidified by different techniques to form the housing area, for example by means of a polymerizable material 4 which will react to rigidify the housing area. It is also possible to use an external strengthener which rigidifies the substrate preventing too great a deformation when the chip is placed. It is also conceivable to modify the mechanical behaviour of the housing area in temporary or permanent manner by means of an optic, magnetic and/or electric stimulus.

In this manner, as illustrated, the flexible substrate comprises a rigid area which is adjacent to a flexible area or surrounded by flexible area. The two areas present different mechanical properties. This difference of behaviour can originate for example from a difference of Young's modulus between the material forming the rigid housing area and the material of the adjacent flexible substrate. The Young's modulus of the housing area is higher than the Young's modulus of the rest of the flexible substrate. The rigid area thus facilitates precise positioning of the chip with respect to the electrically conducting wire and the flexible area enables the advantages of the original substrate to be preserved.

In a privileged embodiment, housing area 5 is associated with a deformation of the substrate. This deformation facilitates placing of the chip with respect to its environment, for example with respect to one or more wires 3.

If substrate 1 is deformed in order to form housing area 5 for electronic chip 2, this housing area 5 can be sunken or salient with respect to the rest of substrate 1. According to the embodiments, sunken or salient housing area 5 corresponds to the surface of chip 2, or represents a larger surface than chip 2, which can facilitate positioning thereof or enable assembly of two chips side by side. The housing area can also correspond to a smaller surface than the chip, if the housing area is salient.

Figure 2:
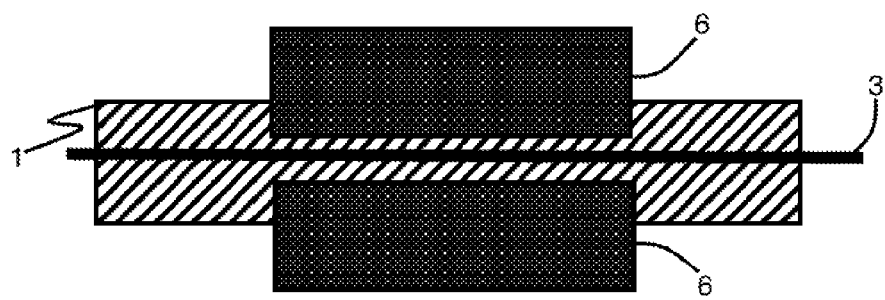
FIGS. 2 to 4 represent a method for assembling a chip on a substrate, in schematic manner in cross-section.

Deformation of substrate 1 can be obtained by any suitable technique. As illustrated in FIG. 2, deformation can be achieved by means of die-stamping of the substrate between two half-matrices 6.

According to the patterns formed in half-matrices 6, the opposing surfaces of substrate 1 can present salient or sunken areas with any shapes. Formation of a salient or sunken housing area 5 is achieved in conventional manner according to conventional die-stamping techniques.

According to the half-matrices used, substrate 1 presents a sunken area, two sunken areas facing one another on each side of the substrate or a sunken area facing a salient area. In the example illustrated in FIG. 3, two sunken areas are facing one another.

When substrate 1 is a flexible substrate, it is difficult for the substrate to keep a predefined shape of housing area 5. It is then advantageous to use a substrate comprising a polymerizable material 4 or any other material which can locally rigidify the substrate. The polymerizable material can be an intrinsic constituent of the substrate or it can be added onto the substrate, for example by impregnation or by deposition of a polymerizable material on the substrate. The impregnation or deposition can be generalized or only localized to the future housing area of the chip. When polymerization of the polymerizable material is performed, the mechanical properties of the latter are modified so as to make it more rigid. Transformation of the polymerizable material enables the substrate to be rigidified. The same is true for the other materials that can be used.

According to the porosity of substrate 1 and its affinity with polymerizable material 4, substrate 1 can be modified locally in its chemical composition and in its mechanical strength. If not, polymerizable material 4 can form a rigid layer on the surface of flexible substrate 1 so as to prevent subsequent deformation.

Figure 3:
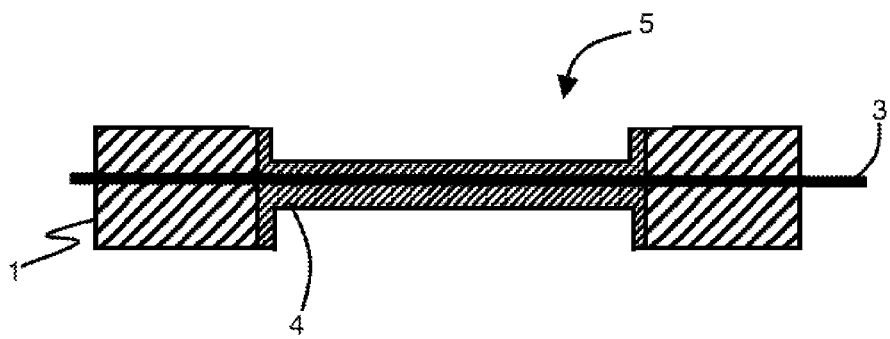

As illustrated in FIG. 3, once housing area 5 has been formed, polymerizable material 4 is treated so as to make it react. Substrate 1 is then rigidified at least at the level of housing area 5 of chip 2. Polymerization of polymerizable material 4 can be achieved by any suitable technique, for example by means of heat treatment or by means of illumination under electromagnetic or electronic radiation.

Rigidifying of housing area 5 is preferably performed as soon as possible after deformation of the latter in order to avoid a change of shape. In preferential manner, transformation of polymerizable material 4 is at least partially performed when pressing or die-stamping, is performed, in order to keep a footprint that is as close as possible to what is required in substrate 1.

Figure 4:
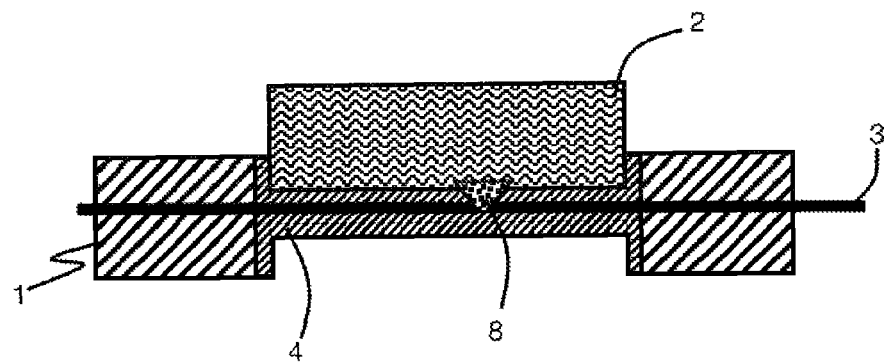

As illustrated in FIG. 4, in a particular embodiment, once substrate 1 has been rigidified at the level of housing area 5, chip 2 is arranged on housing area 5. The main surface of chip 2 is placed in contact with the substrate and the latter are secured to one another. This securing of chip 2 with substrate 1 is performed by any suitable technique, or example by gluing, by embedding the chip in its housing area or by mechanical securing between the chip and a cooperating element arranged on the opposite surface of the substrate.

Figure 5:
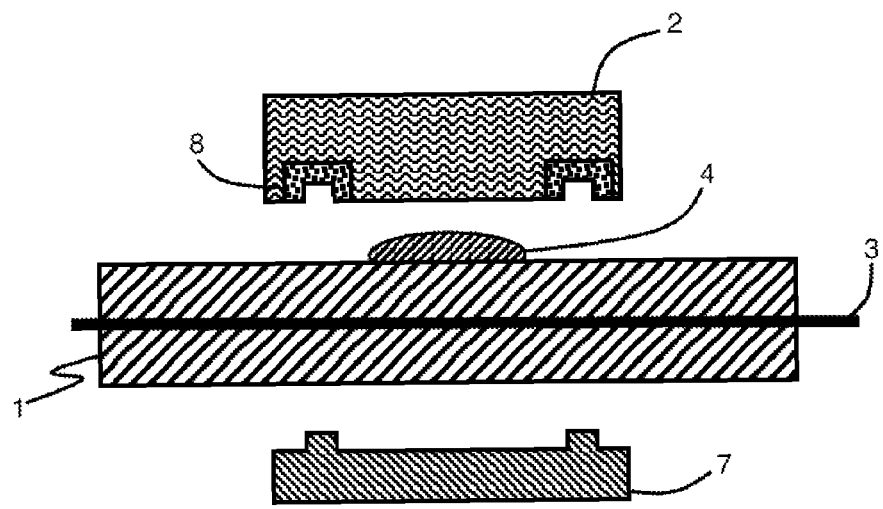
FIGS. 5 and 6 represent a second method for assembling a chip on a substrate, in schematic manner in cross-section.
Figure 6:
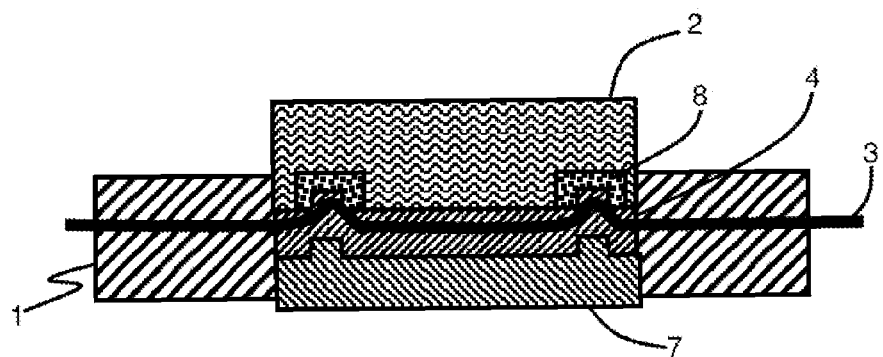

In another embodiment illustrated in FIGS. 5 and 6, it is also possible to perform pressing of substrate 1 directly by means of chip 2. The main surface of chip 2 is placed in contact with the main surface of substrate 1 and a pressure is applied. Substrate 1 then deforms to take exactly the same shape as chip 2. Advantageously, a counter-plate 7 is used in order to master deformation of housing area 5 better. This deformation can be definitive or provisional. The pressure applied is advantageous to ensure an efficient mechanical contact between substrate 1 and chip 2.

As for die-stamping, various forms of footprints are accessible on one or two surfaces of substrate 1. In this particular case, formation of housing area 5 and placing of chip 2 are performed simultaneously. In an alternative embodiment, substrate 1 is at least locally rigidified by a polymerizable material 4 or by another technic so as to preserve the shape of housing area 5 once the pressing step has been terminated.

In other embodiments, rigidification of the housing area is linked to the use of a counter-plate 7. It is then not necessary to use a polymerizable material. Counter-plate 7 is associated with the substrate which has the effect of defining a more rigid area, housing area 5. The chip is then arranged on the substrate at the level of housing area 5. Chip 2 and counter-plate 7 are separated by substrate 1.

Chip 2 is electrically connected to substrate 1. An electric connection area 8 arranged on the main surface of chip 2 is in electric contact with an electrically conducting wire 3 of substrate 1. Electric contact area 8 of chip 2 is for example an area that is salient from the main surface of chip 2, or on the contrary an area that is sunken with respect to this same surface. Electric contact area 8 can be achieved by micro-inserts, by bumps made from fusible metallic material or by stud-bumps, i.e. bumps of particular shape. Electric connection can also be made by a conducting glue, preferably a conducting anisotropic glue. Conducting wire 3 of substrate 1 enables power supply and/or communication of chip 2 with another element electrically connected to substrate 1, a chip or a passive element.

When placing of chip 2 is performed in its housing area 5, the pressure exerted by the chip on the substrate enables electric contact between an electrically conducting wire 3 and electric connection area 8 to be ensured.

The salient connection areas enable the insulating material coating the electrically conducting wire to be pierced thus at least partially baring the latter. In preferential manner, the electric connection areas that are salient from the main surface of the chip have a pointed shape and/or a diameter smaller than or equal to 30 micrometers which facilitates penetration of salient area 8 up to conducting wire 3.

According to another embodiment, an additional chemical, ion or mechanical etching step is performed in order to form the contact areas without baring wire 3.

A sunken connection area, i.e. inside the chip, can also connect an electrically conducting wire 3 by taking advantage of the deformation of the conducting wire caused by counter-plate 7.

In order to obtain contact between an electric connection area 8 and an electrically conducting wire 3, housing area 5 has to be located according to the electrically conducting wires and the electric connection areas of the chip.

Figure 7:
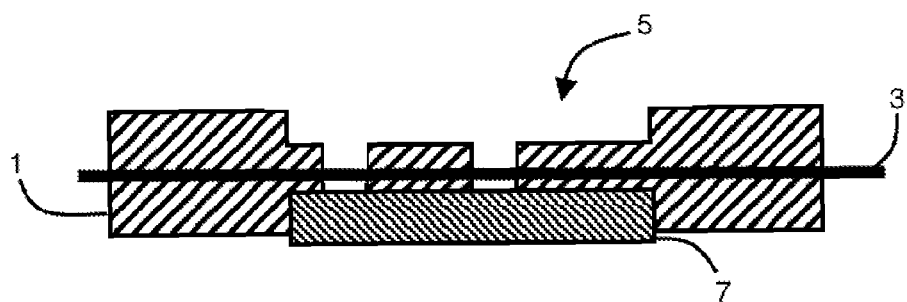
FIG. 7 represents a step of an alternative embodiment of an assembly method, in schematic manner in cross-section.

In another embodiment illustrated in FIG. 7, access to the electrically conducting wire can be achieved by means of an additional step which consists in chemical etching and/or ion etching and/or mechanical etching of the insulating material situated facing the future electric connection area. In the illustrated embodiment, access to the conducting wire 3 is achieved by passing through the substrate and by stopping at the level of counter-plate 7. It is also possible not to use a counter-plate 7 or to also etch counter-plate 7 to obtain a pass-through contact.

Depending on the etching technique used, the conducting wire is eliminated at the same time as the rest of substrate 1 and connection area 8 then fills the void area that is created. Electric contact is obtained by means of the lateral surface of the electric wire and the connection area ensures continuity of the signal in the rest of the electric wire. In another alternative embodiment, conducting wire 3 is not or not completely eliminated during elimination of the substrate 1. The insulating layer coating the conducting wire is for the most part eliminated.

Chip 2 can comprise one or more additional electric connection areas 8 (FIG. 1). The pitch between two active electric connection areas 8 is free and is a function of the pitch existing between the wires.

Inversely, if substrate 1 comprises several electrically conducting wires 3, the distance between two parallel or substantially parallel conducting wires 3 has to be compatible with the distance existing between two electric connection areas 8.

In the case where several electric connection areas 8 are connected to a single conducting wire 3, conducting wire 3 can be cut between two chips or between two connection areas of the same chip in order to prevent any short-circuiting (FIG. 1). The wire is cut by any suitable technique, for example by means of a punch or by a laser beam.

In certain embodiments, counter-plate 7 is only used in the substrate deformation step and, in this case, it is not present in the final device. In other embodiments, it can also act as mechanical strengthener for chip 2 and/or for substrate 1, counter-plate 7 then being secured to the electronic chip. Counter-plate 7 and chip 2 are located on either side of substrate 1.

In an alternative embodiment, counter-plate 7 is formed by an additional electronic chip 2 which is mechanically connected to substrate 1 and to first chip 2. In preferential manner, the two chips 2 are electrically connected to one another. This electric connection can be achieved directly by electric connection areas 8 having complementary shapes which face one another. In this case, there is no passage via wire 3 for connection between the two chips. This electric connection can also be made by passing via one more electrically conducting wires 3. The electric connections between the two chips 2 are then advantageously located in the facing surface of the two chips 2.

Mechanical connection between electronic chip 2 and counter-plate 7 can be made by any suitable means, for example by means of a glue or of forcibly engaged structures.

Figure 8:
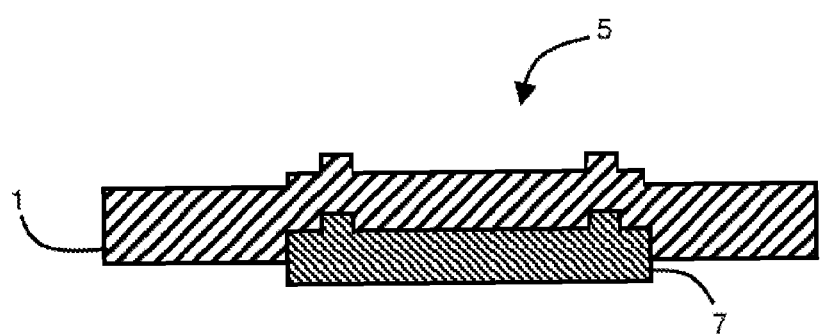
FIGS. 8 and 9 represent steps of another alternative embodiment of an assembly method, in schematic manner in cross-section.
Figure 9:
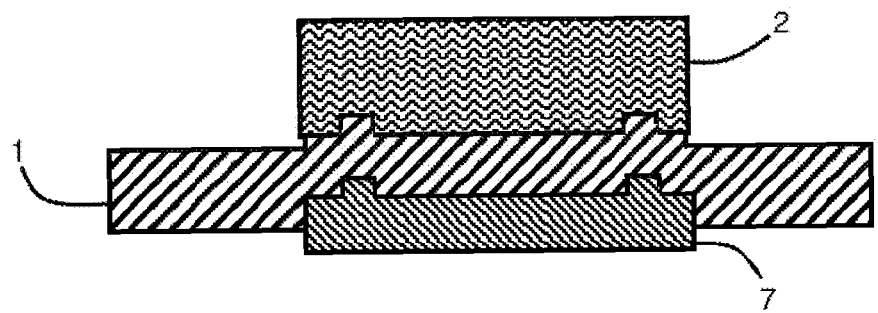

In another embodiment illustrated in FIGS. 8 and 9 and which can be combined with the previous embodiments, housing area 5 of chip 2 is made by means of counter-plate 7, by pressing counter-plate onto the substrate. The substrate is deformed and the counter-plate defines a salient area on the opposite surface to the one comprising the counter-plate (FIG. 8). It is also conceivable for the counter-plate to comprise one or more salient patterns. The salient housing area can be of any shape. It can have the same pattern as that of the counter-plate. It is further conceivable for salient patterns of counter-plate 7 to pass through substrate 1 or to print raised patterns on housing area 5 which act as error preventers imposing the position and orientation of chip 2 to be subsequently assembled (FIG. 9).

Figure 10:
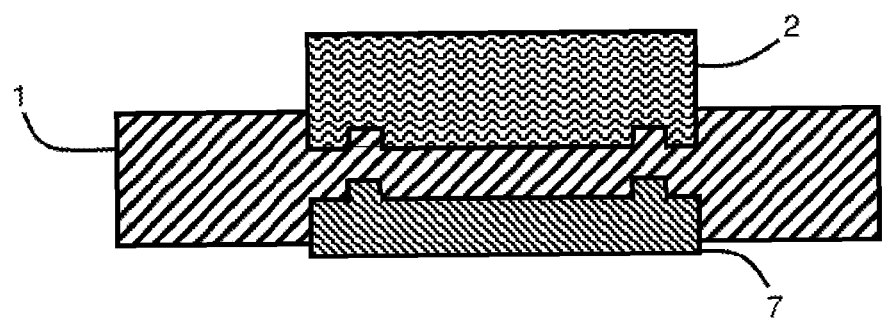
FIGS. 10 and 11 represent steps of a third alternative embodiment of an assembly method, in schematic manner in cross-section.
Figure 11:
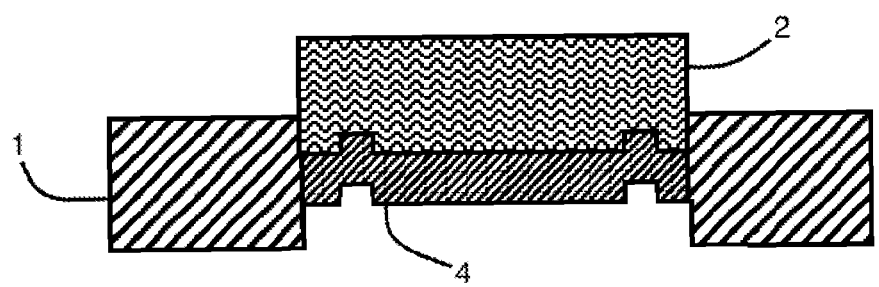

As illustrated in FIGS. 9 and 10, alignment of chip 2 with respect to counter-plate 7 can be achieved with a housing area salient from substrate 1 (FIG. 9) or in the volume of the substrate (FIG. 10). The counter-plate can also be used for formation of a housing area associated with two adjacent chips. Counter-plate 7 can advantageously be used to align the two chips 2 with respect to one another and with respect to wires 3.

Once chip 2 has been aligned on wires 3 of the flexible substrate and secured to the substrate, counter-plate 7 can be removed by any suitable technique. Counter-plate 7 can also be kept.

Thus, by aligning counter-plate 7 provided with error preventers with respect to conducting wire 3, alignment of chip 2 with respect to conducting wire 3 is automatic. The error preventer can also form an electric connection area.

Pressing of the counter-plate results in deformation of the substrate either to form a salient housing area or for passage of one or more error preventers through the substrate.

To ensure electric connection between a conducting wire 3 and an electric connection area 8, it is preferable to perform alignment of chip 2 with respect to conducting wire 3. This alignment can be performed when definition of housing area performed or when placing of chip 2 in housing area 5 is performed.

In a particular embodiment illustrated in FIG. 1, two chips 2 each having several connection areas 8 are integrated on substrate 1. To obtain easy and effective communication between these two chips, electric connection areas of these two chips are connected to a single conducting wire. On the other hand, to prevent any short-circuiting between two areas 8 not having to communicate with one another but nevertheless connected to the same wire 3, the electrically conducting wire simply has to be locally etched.

In this manner, it is easy to assemble different chips on a flexible substrate and to associate the latter to form specific functions according to the wires shared between the chips and the cutting areas.

In the embodiments illustrated in FIGS. 8 to 11, conducting wire 3 and electric connection contact 8 are not represented in the cross-sectional view. They can be represented in similar manner to the previous views, but it is also possible for connection to take place in another plane that is not shown. In the latter case, the deformations present in housing area 5 act as error preventer.

Figure 12:
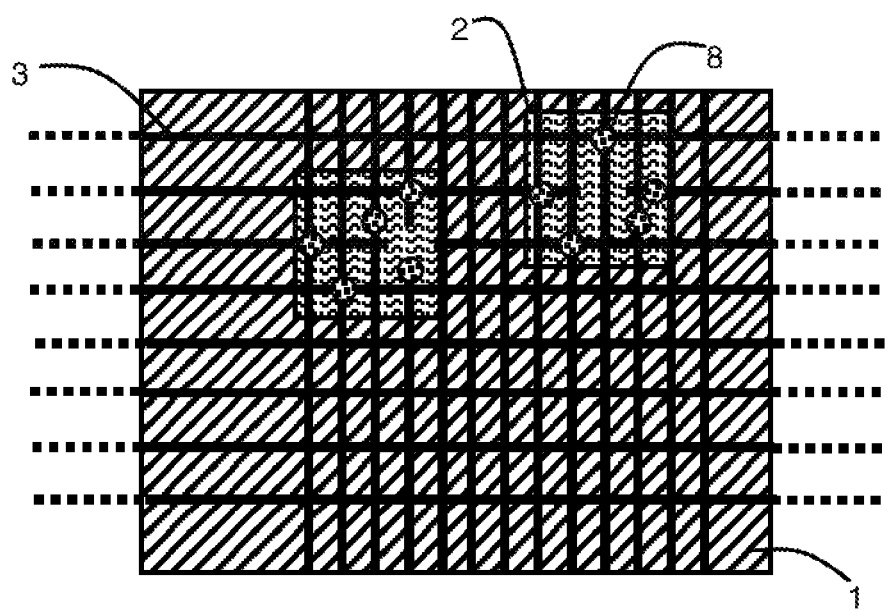
FIG. 12 represents another embodiment of two chips mounted on a substrate, in schematic manner in top view.

In another embodiment illustrated in FIG. 12, electrically conducting wires 3 are organized in matrices, i.e. there are at least two series of differently oriented wires, preferably in perpendicular directions. One or more chips present a plurality of electric connection areas 8. Certain connections 8 are electrically associated with wires oriented in a first direction whereas other connections of the same chip are electrically associated with wires oriented in a second direction.

Depending on the associations that are sought to be made, electrically conducting wires 3 that are facing chip 2 can be connected or left free. One and the same wire 3 can be connected to several connection areas 8 of chip 2. If different signals have to transit in different areas of one and the same wire, the wire is cut to prevent creation of parasite signals. For example purposes, the electric wire is cut at the level of the chip between two consecutive connection areas 8 if the signal input to the chip via a first area 8 is re-injected after processing by a second area 8 on the same wire 3 in the direction of another chip.

In a particular embodiment, the substrate comprises a plurality of electrically conducting wires arranged in two parallel planes. The wires can be arranged in any manner in each plane. Each series of wires can be oriented in a single direction, these two directions being parallel or not. It is also conceivable to have a matrix organisation of wires 3 of each plane.

When chip 2 is electrically connected to substrate 1, connection can be made on one of the planes of wires 3 or on both planes of wires 3. In a particular embodiment, an electric connection area 8 of chip 2 performs simultaneous connection of two wires 3 present on two different planes at the level of a superposition area.

In another embodiment which can be combined with the previous embodiment, the chip comprises means for making an interconnection between two superposed wires. An interconnection can be made by means of a pressure exerted on two superposed wires in order to force electric connection of the latter. Interconnection can also be achieved by means of an electric contact originating from the chip and which directly touches the two electrically conducting wires 3.

This interconnection between two wires 3 can be electrically connected to chip 2 or not.

The method is particularly advantageous in the case of use of a substrate of textile type as the latter is particularly sensitive to deformation when placing of chip is performed. Rigidifying the housing area enables the deformations to be reduced thereby mastering alignment of the chip with respect to the conducting wire.

The invention claimed is:

1. A method for assembling an electronic chip on a flexible substrate comprising the successive following steps:
    providing the flexible substrate provided with at least one electrically conducting wire and with a polymerizable material;
    making the polymerizable material react in a first area of the flexible substrate so as to stiffen this first area of the flexible substrate and not to react in a second area of the flexible substrate, the first area forming a housing area for the electronic chip on a surface of the flexible substrate, the housing area representing a more rigid area of the flexible substrate as compared to the second area; and
    arranging the electronic chip in the housing area and electrically connecting the at least one electrically conducting wire with an electric connection area of the chip.

2. The method according to claim 1, further comprising impregnating the flexible substrate by the polymerizable material before forming the housing area.

3. The method according to claim 1, wherein the polymerizable material is an epoxy resin.

4. The method according to claim 1, further comprising a counter-plate that is an additional electronic chip electrically coupled with the electronic chip.

5. The method according to claim 1, wherein the electric connection area of the chip is salient from a main surface of the electronic chip.

6. The method according to claim 1, wherein the flexible substrate is a textile.

7. The method according to claim 1, wherein the substrate comprises a plurality of electrically conducting wires arranged in two parallel planes and in that the chip is electrically connected to one of the plurality of electrically conducting wires of each plane.

8. The method according to claim 7, wherein the electronic chip comprises a salient part configured for applying pressure on two superposed electrically conducting wires to form an interconnection between said two superposed electrically conducting wires.

9. A method for assembling an electronic chip on a flexible substrate comprising the following steps:
    providing the flexible substrate provided with at least one electrically conducting wire and with a polymerizable material;
    making the polymerizable material react in a first area of the flexible substrate so as to stiffen this first area of the flexible substrate and to form a housing area for the electronic chip on a surface of the flexible substrate;
    arranging the electronic chip in the housing area and electrically connecting the at least one electrically conducting wire with an electric connection area of the chip and with an additional electric connection area of the electronic chip; and cutting the at least one electrically conducting wire between the electric connection area of the electronic chip and the additional electric connection area of the electronic chip.

10. The method according to claim 9, wherein the cutting is performed by a punch or a laser beam.

11. A method for assembling an electronic chip on a flexible substrate comprising the following steps:
   providing the flexible substrate provided with at least one electrically conducting wire and with a polymerizable material;
   making the polymerizable material react in a first area of the flexible substrate so as to stiffen this first area of the flexible substrate and not to react in a second area of the flexible substrate, the first area forming a housing area for the electronic chip on a surface of the flexible substrate, the housing area representing a more rigid area of the flexible substrate as compared to the second area; and
   pressing and securing the electronic chip against a counter-plate, the electronic chip being arranged in the housing area and electrically connecting the at least one electrically conducting wire with an electric connection area of the chip.

12. The method according to claim 11, wherein the counter-plate is an additional electronic chip electrically coupled with the electronic chip.

13. A method for assembling an electronic chip on a flexible substrate comprising the following steps:
   providing the flexible substrate provided with at least one electrically conducting wire and with a polymerizable material;
   deforming a portion of the flexible substrate comprising the polymerizable material;
   making the polymerizable material react in a first area of the deformed portion of the flexible substrate so as to stiffen this first area of the flexible substrate and to form a housing area for the electronic chip on a surface of the flexible substrate; and
   arranging the electronic chip in the housing area and electrically connecting the at least one electrically conducting wire with an electric connection area of the chip.

14. The method according to claim 13, further comprising pressing a counter-plate onto the flexible substrate for deforming the portion of the flexible substrate comprising the polymerizable material and removing the counter plate before arranging the electronic chip in the housing area.

15. The method according to claim 13, further comprising pressing a counter-plate onto the flexible substrate for deforming the portion of the flexible substrate comprising the polymerizable material and removing the counter plate after arranging the electronic chip in the housing area.

16. The method according to claim 13, further comprising pressing a counter-plate onto the flexible substrate for deforming the portion of the flexible substrate and wherein the counter-plate comprise at least one salient part configured for cooperating with a recessed part of the electronic chip.

17. The method according to claim 13, wherein the deforming is performed by die-stamping the flexible substrate between two half-matrices.

18. The method according to claim 13, further comprising pressing the electronic chip onto the flexible substrate for deforming the portion of the flexible substrate comprising the polymerizable material.

19. The method according to claim 13, further comprising pressing the electronic chip by means of a counter-plate for deforming the portion of the flexible substrate comprising the polymerizable material.

* * * * *